United States Patent
Lim et al.

(10) Patent No.: US 9,153,651 B2
(45) Date of Patent: Oct. 6, 2015

(54) THIN FILM TRANSISTOR AND METHOD FOR MANUFACTURING THE SAME

(71) Applicant: Electronics and Telecommunications Research Institute, Daejeon (KR)

(72) Inventors: Sang Chul Lim, Daejeon (KR); Ji-Young Oh, Daejeon (KR); Seongdeok Ahn, Daejeon (KR); Kyoung Ik Cho, Daejeon (KR); Sang Seok Lee, Chungcheongnam-do (KR); Jae Bon Koo, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 156 days.

(21) Appl. No.: 13/757,699

(22) Filed: Feb. 1, 2013

(65) Prior Publication Data

US 2014/0084283 A1 Mar. 27, 2014

(30) Foreign Application Priority Data

Sep. 24, 2012 (KR) .......................... 10-2012-0105889

(51) Int. Cl.
*H01L 21/00* (2006.01)
*H01L 21/84* (2006.01)
*H01L 29/26* (2006.01)

(52) U.S. Cl.
CPC .................................. *H01L 29/263* (2013.01)

(58) Field of Classification Search
CPC ............ H01L 29/4908; H01L 27/3274; H01L 29/263; H01L 29/7869; H01L 29/26
USPC ............................................. 438/158; 257/43
See application file for complete search history.

(56) References Cited

U.S. PATENT DOCUMENTS

| | | | |
|---|---|---|---|
| 8,541,258 B2* | 9/2013 | Kim et al. | 438/104 |
| 2007/0046191 A1* | 3/2007 | Saito | 313/506 |
| 2008/0197414 A1* | 8/2008 | Hoffman et al. | 257/347 |
| 2011/0221475 A1* | 9/2011 | Koyama et al. | 326/120 |
| 2012/0161126 A1* | 6/2012 | Yamazaki | 257/43 |

FOREIGN PATENT DOCUMENTS

KR 10-2010-0013554 A 2/2010

* cited by examiner

*Primary Examiner* — Theresa T Doan

(57) ABSTRACT

Provided are a thin film transistor and a method for manufacturing the same. The thin film transistor manufacturing method includes forming a gate electrode on a substrate, forming an active layer that is adjacent to the gate electrode and includes an oxide semiconductor, forming an oxygen providing layer on the active layer, forming a gate dielectric between the gate electrode and the active layer, forming source and drain electrodes coupled to the active layer, forming a planarizing layer covering the gate electrode and the gate dielectric, forming a hole exposing the active layer, and performing a heat treatment process onto the planarizing layer in an atmosphere of oxygen.

13 Claims, 9 Drawing Sheets

THIN FILM TRANSISTOR AND METHOD FOR MANUFACTURING THE SAME

CROSS-REFERENCE TO RELATED APPLICATIONS

This U.S. non-provisional patent application claims priority under 35 U.S.C. §119 of Korean Patent Application No. 10-2012-0105889, filed on Sep. 24, 2012, the entire contents of which are hereby incorporated by reference.

BACKGROUND OF THE INVENTION

The present invention disclosed herein relates to a thin film transistor and a method for manufacturing the same, and more particularly, to a thin film transistor including an oxide semiconductor and a method for manufacturing the same.

As the information society advances, a display device for displaying information is more actively developed. The display device includes a liquid crystal display device, an organic electro-luminescence display device, a plasma display panel, and a field emission display device.

These display devices are widely applied to mobile phones, navigators, monitors, and televisions. The display devices include pixels arranged in matrix forms and thin film transistors for turning on/off the pixels. By the turning on/off operations of the thin film transistors, the pixels are controlled.

The thin film transistor includes a gate electrode for receiving a gate signal, a source electrode for receiving data voltage, and a drain electrode for outputting the data voltage. The thin film transistor also includes an active layer for forming a channel. Recently, researches have been actively carried out to improve functions and performance of the thin film transistors.

SUMMARY OF THE INVENTION

The present invention provides a thin film transistor that stably operates and a method for manufacturing the same.

The present invention also provides a thin film transistor with improved reliability and a method for manufacturing the same.

Embodiments of the present invention provide methods for manufacturing a thin film transistor, including forming a gate electrode on a substrate, forming an active layer that is adjacent to the gate electrode and includes an oxide semiconductor, forming an oxygen providing layer on the active layer, forming a gate dielectric between the gate electrode and the active layer, forming source and drain electrodes coupled to the active layer, forming a planarizing layer covering the gate electrode and the gate dielectric, forming a hole exposing the active layer, and performing a heat treatment process onto the planarizing layer in an atmosphere of oxygen.

In some embodiments, the oxygen providing layer may include a metal oxide that emits oxygen at a first temperature.

In other embodiments, the oxygen providing layer may include AgO.

In still other embodiments, the heat treatment process may be performed at a second temperature higher than the first temperature.

In even other embodiments, oxygen atoms provided by the heat treatment process may be supplied into the active layer through the hole.

In yet other embodiments, oxygen atoms in the oxygen providing layer may be supplied into the active layer by the heat treatment process.

In further embodiments, the hole may pass through the planarizing layer, the gate dielectric, and the oxygen providing layer to expose a part of an upper surface of the active layer.

In still further embodiments, the method may further include forming a buffer layer on the substrate.

In even further embodiments, the forming of the gate dielectric may include forming a first insulating layer between the gate electrode and the active layer, forming a second insulating layer on the first insulating layer, and forming a third insulating layer between the first insulating layer and the second insulating layer, wherein the first and second insulating layers may include inorganic materials and the third insulating layer may include organic materials.

In other embodiments of the present invention, thin film transistors include a gate electrode on a substrate, an active layer disposed to be adjacent to the gate electrode and including an oxide semiconductor, an oxygen providing layer on the active layer, a gate dielectric between the gate electrode and the active layer, source and drain electrodes coupled to the active layer, a planarizing layer covering the gate electrode and the gate dielectric, and a hole exposing the active layer.

In some embodiments, the hole may pass through the planarizing layer, the gate dielectric, and the oxygen providing layer to expose a part of an upper surface of the active layer.

In other embodiments, the hole may pass through the planarizing layer and the oxygen providing layer to expose a part of an upper surface of the active layer.

In still other embodiments, the oxygen providing layer may include AgO.

In even other embodiments, the gate dielectric may include a first insulating layer between the gate electrode and the active layer, a second insulating layer on the first insulating layer, and a third insulating layer between the first insulating layer and the second insulating layer, wherein the first and second insulating layers may include inorganic materials and the third insulating layer may include organic materials.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Hereinafter, it will be described about an exemplary embodiment of the present invention in conjunction with the accompanying drawings.

Figure 1:
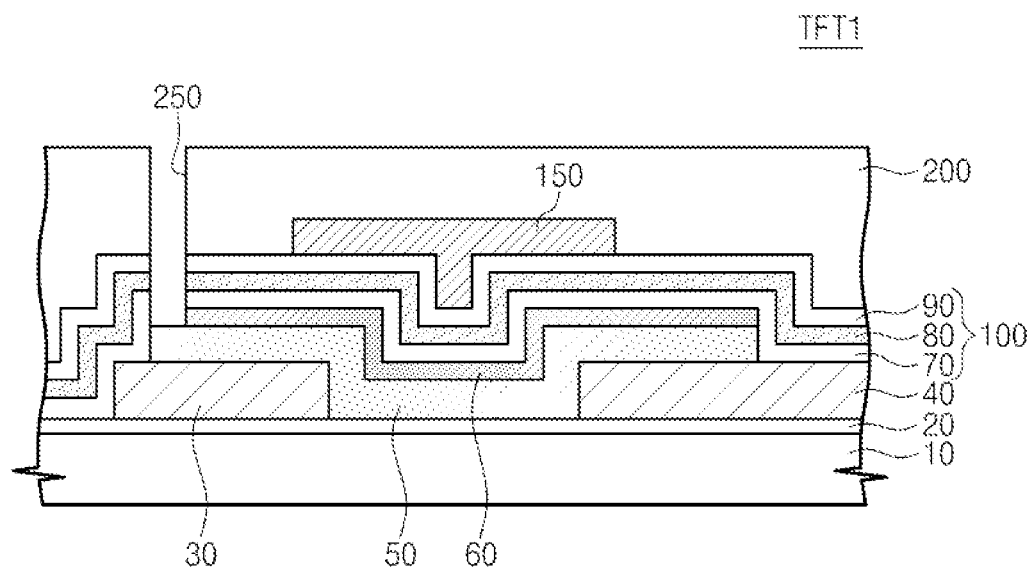
FIG. 1 is a cross-sectional view illustrating a thin film transistor according to an embodiment of the present invention.

FIG. 1 is a cross-sectional view illustrating a thin film transistor according to an embodiment of the present invention.

Referring to FIG. 1, a thin film transistor TFT1 according to an embodiment of the present invention may include: a buffer layer 20 on a substrate 10; a gate electrode 150 on the buffer layer 20; an active layer 50 disposed to be adjacent to the gate electrode 150; a gate dielectric 100 between the gate electrode 150 and the active layer 50; an oxygen providing layer 60 between the gate dielectric 100 and the active layer 50; a source electrode 30 and a drain electrode 40 separated from each other, the active layer 50 being disposed therebetween; a planarizing layer 200 covering the gate electrode 150 and the gate dielectric 100; and a hole 250 passing through the planarizing layer 200, the gate dielectric 100, and the oxygen providing layer 60 to expose the active layer 50.

The substrate film 10 may be a plastic substrate, a metal substrate, a glass substrate, or a silicon substrate. For instance, the plastic substrate may include polyethersulfone (PES), polyethylene terephthalate (PET), polycarbonate (PC), polyimide (PI), polyethylene naphthalate (PEN), and polyacrylate (PAR). The substrate 10 may be a flexible substrate.

The buffer layer 20 may be disposed on the substrate 10. The buffer layer 20 may be provided to prevent metal materials deposited on the substrate from being cracked or exfoliated when heat is applied onto the substrate 10. For instance, the buffer layer 20 may include inorganic materials.

The source electrode 30 and the drain electrode 40 may be provided on the buffer layer 20. The source electrode 30 and the drain electrode 40 may be separated from each other. The source and drain electrodes 30 and 40 may include platinum (Pt), gold (Au), titanium-aluminum alloy (Ti/Al/Ti), molybdenum (Mo), indium tin oxide (ITO), zinc oxide (ZnO), zinc tin oxide (ZTO), and carbon nano tube (CNT).

The active layer 50 may be provided on the buffer layer 20 and may be disposed between the source electrode 30 and the drain electrode 40. A part of the active layer 50 may be extended onto upper surfaces of the source electrode 30 and the drain electrode 40 so that the active layer 50 may at least partially overlap the source and drain electrodes 30 and 40. When the thin film transistor TFT1 is operated, the active layer 50 may form a channel between the source electrode 30 and the drain electrode 40. The active layer 50 may include an oxide semiconductor. The oxide semiconductor may be a ternary or quaternary amorphous oxide semiconductor including oxygen. For instance, the active layer 50 may include one of zinc oxide, zinc tin oxide, indium zinc oxide, gallium zinc oxide, and indium gallium zinc oxide. In general, the oxide semiconductor may include an oxygen vacancy. By controlling the concentration of the oxygen vacancy of the oxide semiconductor in the active layer 50, performance of the thin film transistor TFT1 may varies.

The oxygen providing layer 60 may be provided between the active layer 50 and the gate dielectric 100. The oxygen providing layer 60 may include a metal oxide. The metal oxide may emit oxygen atoms at a first temperature. For instance, the oxygen providing layer 60 may include a silver oxide (AgO). The silver oxide (AgO) may emit oxygen at a temperature of about 100° C. Therefore, when heat, of which temperature is higher than the first temperature, is applied to the thin film transistor TFT1 by a following heat treatment process, oxygen atoms included in the oxygen providing layer 60 may be emitted from the oxygen providing layer 60 and may be diffused into the active layer 50. The diffused oxygen atoms may fill the oxygen vacancies of the oxide semiconductor in the active layer 50. Since the oxygen vacancy concentration in the oxide semiconductor in the active layer 50 is reduced, threshold voltage characteristics of the thin film transistor including the oxide semiconductor are improved, thereby improving device performance.

The gate dielectric 100 may be provided between the oxygen providing layer 60 and the gate electrode 150. The gate dielectric 100 may cover the oxygen providing layer 60, the active layer 50, the source drain electrodes 30 and 40, and the buffer layer 20. The gate dielectric 100 may include sequentially layered first to third insulating layers 70, 80, and 90.

The first insulating layer 70 may contact the oxygen providing layer 60, the active layer 50, the source/drain electrodes 30 and 40, and the buffer layer 20. The first insulating layer 70 may protect the active layer 50 and parts of the source and drain electrodes 30 and 40 exposed by the active layer 50. The first insulating layer 70 may be an inorganic layer. For instance, the first insulating layer 70 may include $Al_2O_3$. The third insulating layer 90 may be disposed on the first insulating layer 70 and may contact the gate electrode 150. The third insulating layer 90 may reduce contact resistance of the gate electrode 150. The third insulating layer 90 may be an inorganic layer. For instance, the third insulating layer 90 may include $Al_2O_3$. The second insulating layer 80 may be disposed between the first insulating layer 70 and the third insulating layer 90. The second insulating layer 80 may substantially insulate the active layer 50 from the gate electrode 150. The second insulating layer 80 may be an organic layer. For instance, the second insulating layer 80 may include SS6908 organic materials (manufacturer: JSR Micro Korea Co., Ltd.).

The gate electrode 150 may be disposed on the gate dielectric 100. The gate electrode 150 may include the same materials as the source and drain electrodes 30 and 40. For instance, the gate electrode 150 may include platinum (Pt), gold (Au), titanium-aluminum alloy (Ti/Al/Ti), molybdenum (Mo), indium tin oxide (ITO), zinc oxide (ZnO), zinc tin oxide (ZTO), and carbon nano tube (CNT).

The planarizing layer 200 may be provided on the substrate 10 and cover the gate electrode 150 and the gate dielectric 100. The planarizing layer 200 may be provided to complement a height difference between the gate electrode 150 and the gate dielectric 100. Therefore, the upper surface of the planarizing layer 200 may have a constant height. The planarizing layer 200 may be an organic layer. For instance, the planarizing layer 200 may include SS6908 organic materials (manufacturer: JSR Micro Korea Co., Ltd.).

The hole 250 may pass through the planarizing layer 200, the gate dielectric 100, and the oxygen providing layer 60 to expose the active layer 50. The hole 250 may be used as a transfer path of oxygen atoms when a following heat treatment process is performed onto the thin film transistor TFT1.

The thin film transistor TFT1 is referred to as a staggered type in which the gate electrode 150 is disposed on the active layer 50 and a height of an upper surface of the active layer 50 varies.

Figure 2:
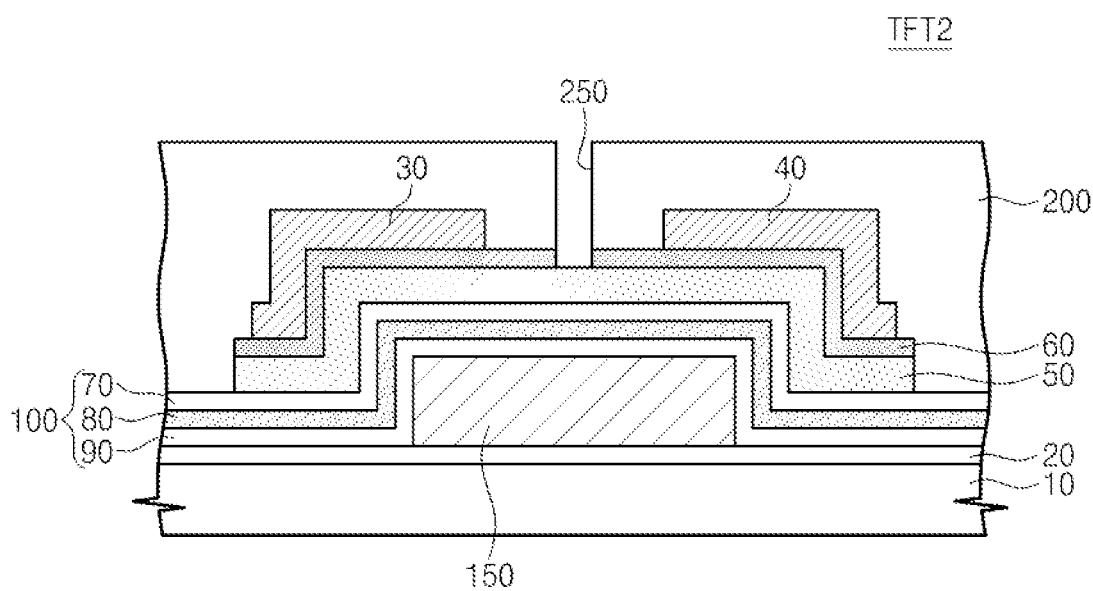
FIGS. 2 to 4 are cross-sectional views illustrating thin film transistors according to other embodiments of the present invention.
Figure 3:
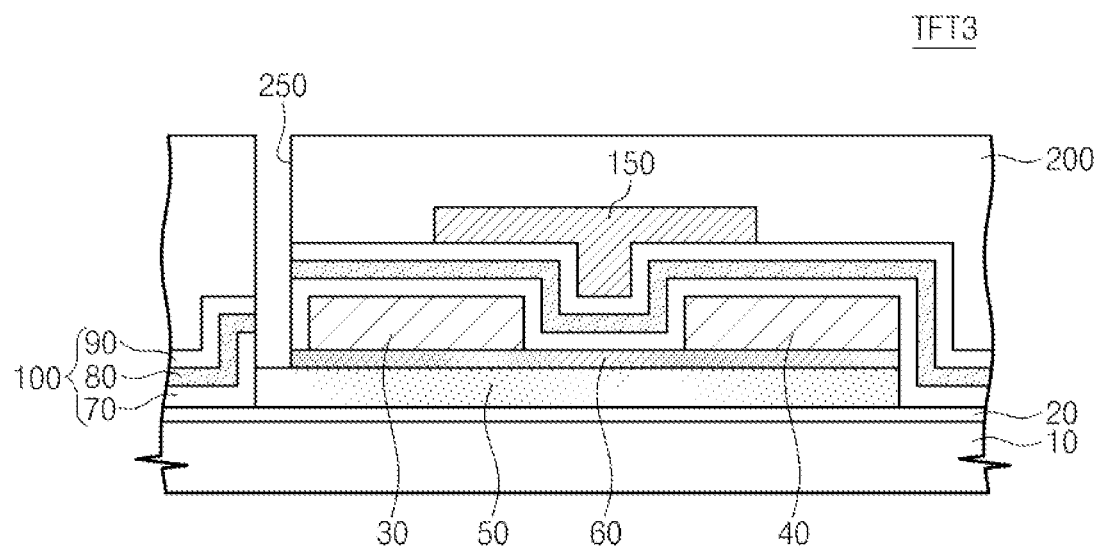
Figure 4:
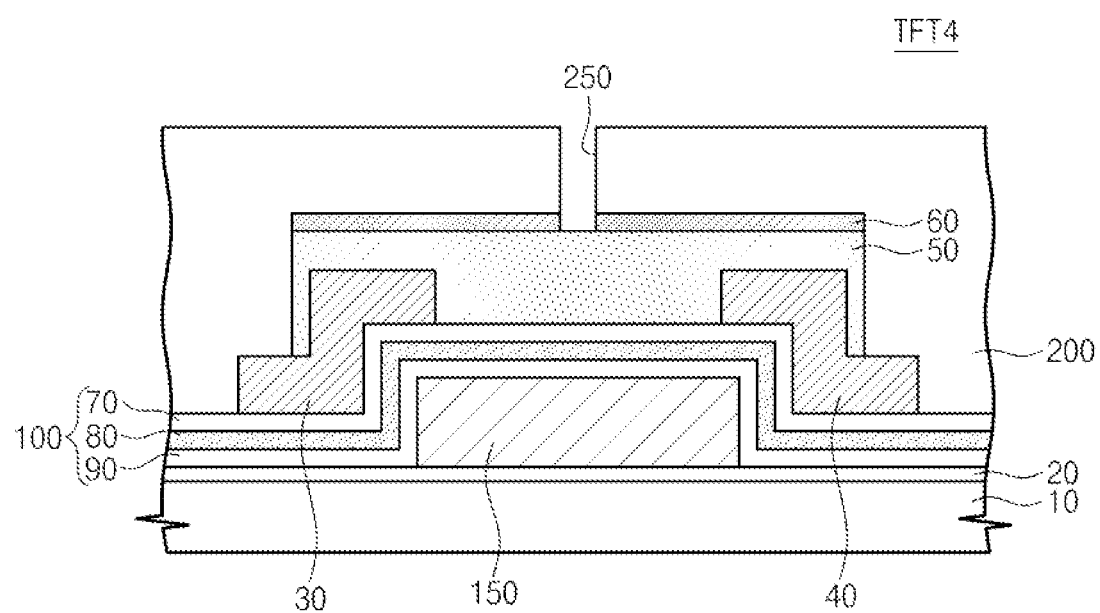

FIGS. 2 to 4 are cross-sectional views illustrating thin film transistors according to other embodiments of the present invention. The same reference numerals are provided for the same elements as the thin film transistor TFT1 that has been described with reference to FIG. 1, and for simple description, redundant descriptions may be omitted.

Referring to FIG. 2, a thin film transistor TFT2 according to another embodiment of the present invention may include: a buffer layer 20 on a substrate 10; an active layer 50 on the buffer layer 20; a gate electrode 150 disposed to be adjacent to the active layer 50; a gate dielectric 100 between the gate electrode 150 and the active layer 50; a source electrode 30 and a drain electrode 40 disposed on the active layer 50 and separated from each other; an oxygen providing layer 60 between the source and drain electrodes 30 and 40 and the active layer 50; a planarizing layer 200 covering the source and drain electrodes 30 and 40, the oxygen providing layer 60, the active layer 50, and the gate dielectric 100; and a hole 250 passing through the planarizing layer 200 and the oxygen providing layer 60 to expose the active layer 50. The thin film transistor TFT2 of FIG. 2 is referred to as an inverted staggered type in which the active layer 50 is disposed on the gate electrode 150 and a height of an upper surface of the active layer 50 varies.

Referring to FIG. 3, a thin film transistor TFT3 according to another embodiment of the present invention may include: a buffer layer 20 on a substrate 10; a gate electrode 150 on the buffer layer 20; an active layer 50 disposed to be adjacent to the gate electrode 150; a gate dielectric 100 between the gate electrode 150 and the active layer 50; an oxygen providing layer 60 between the gate dielectric 100 and the active layer 50; a source electrode 30 and a drain electrode 40 disposed between the oxygen providing layer 60 and the gate dielectric 100 and separated from each other; a planarizing layer 200 covering the gate electrode 150 and the gate dielectric 100; and a hole 250 passing through the planarizing layer 200, the gate dielectric 100, and the oxygen providing layer 60 to expose the active layer 50. The thin film transistor TFT3 of FIG. 3 is referred to as a coplanar type in which the gate electrode 150 is disposed on the active layer 50 and a height of an upper surface of the active layer 50 is uniform.

Referring to FIG. 4, a thin film transistor TFT4 according to another embodiment of the present invention may include: a buffer layer 20 on a substrate 10; an active layer 50 on the buffer layer 20; a gate electrode 150 disposed to be adjacent to the active layer 50; a gate dielectric 100 between the gate electrode 150 and the active layer 50; a source electrode 30 and a drain electrode 40 disposed on the gate dielectric 100 and separated from each other, the active layer 50 being disposed therebetween; an oxygen providing layer 60 on the active layer 50; a planarizing layer 200 covering the oxygen providing layer 60, the active layer 50, the source and drain electrodes 30 and 40, and the gate dielectric 100; and a hole 250 passing through the planarizing layer 200 and the oxygen providing layer 60 to expose the active layer 50. The thin film transistor TFT4 of FIG. 4 is referred to as an inverted coplanar type in which the active layer 50 is disposed on the gate electrode 150 and a height of an upper surface of the active layer 50 is uniform.

Figure 5:
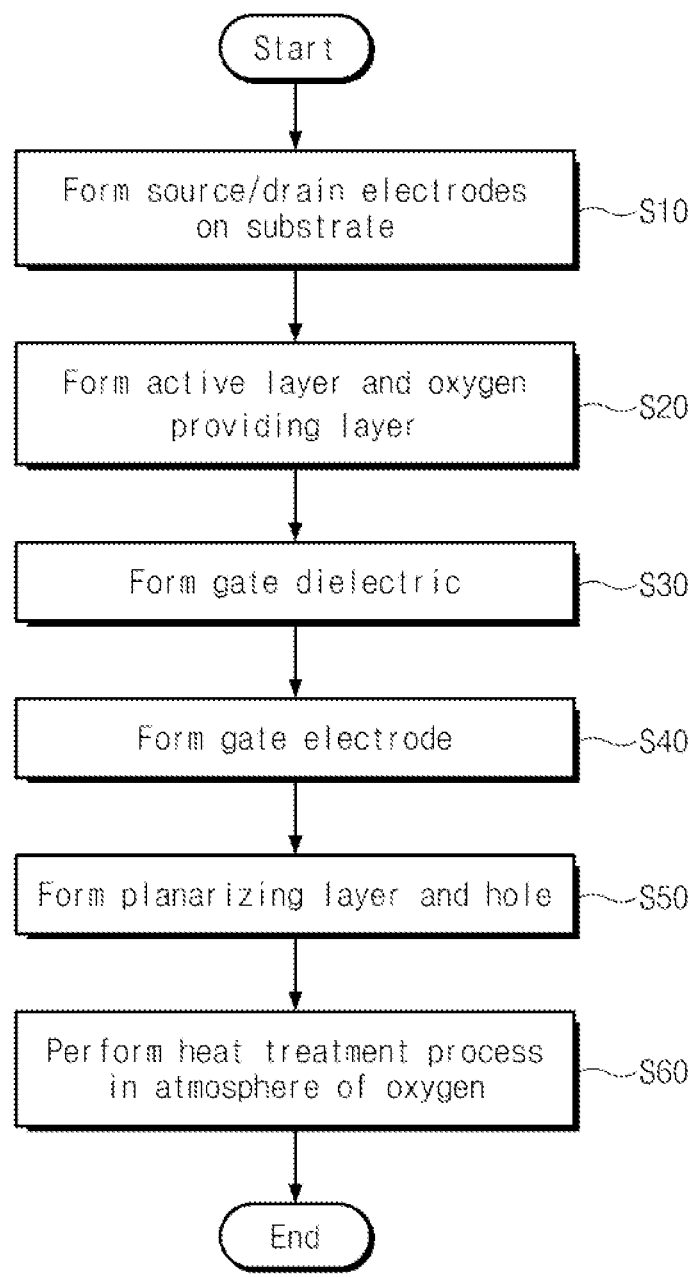
FIG. 5 is a flowchart illustrating a method for manufacturing a thin film transistor according to an embodiment of the present invention.

FIG. 5 is a flowchart illustrating a method for manufacturing a thin film transistor according to an embodiment of the present invention. FIGS. 6 to 12 are cross-sectional views illustrating a method for manufacturing a thin film transistor according to an embodiment of the present invention.

Figure 6:
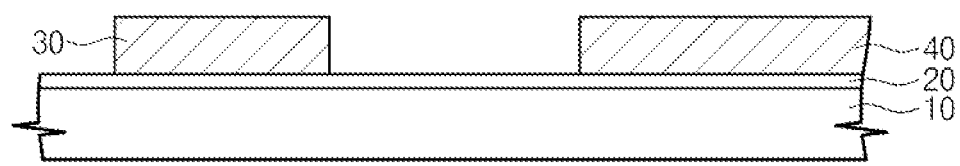
FIGS. 6 to 12 are cross-sectional views illustrating a method for manufacturing a thin film transistor according to an embodiment of the present invention.

Referring to FIGS. 5 and 6, a source electrode 30 and a drain electrode 40 are formed on a substrate 10 in operation S10. The substrate 10 may be one of a plastic substrate, a metal foil substrate, a glass substrate, and a silicon substrate. A buffer layer 20 may be formed on the substrate 10. The buffer layer 20 may include inorganic materials. The buffer layer 20 may be formed on the substrate 10 by performing an atomic layer deposition process. A temperature for the process may be about 150° C., and the buffer layer 20 may be deposited to a thickness of about 300 Å. A first conductive layer may be formed on the buffer layer 20 by performing a metallization process. Or, the first conductive layer may be formed on the buffer layer 20 by using an electron-beam evaporator or a thermal evaporator. By patterning the first conductive layer, the source electrode 30 and the drain electrode 40 separated from each other may be formed on the substrate 10.

Figure 7:
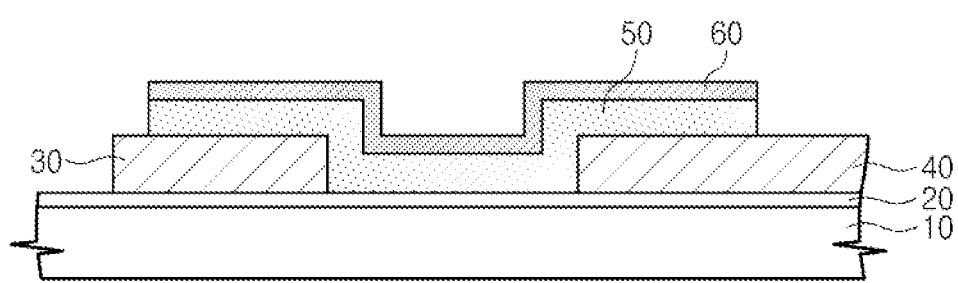

Referring to FIGS. 5 and 7, an active layer 50 and an oxygen providing layer 60 are formed on the substrate 10 in operation S20. By performing a sputtering process according to a vacuum evaporation method, an oxide semiconductor layer may be formed on the substrate 10. The oxide semiconductor layer may be, for instance, an indium gallium zinc oxide (IGZO) or zinc oxide. For instance, a composition ratio of indium:gallium:zinc of the IGZO may be 2:2:1, 2:1:2, or 2:1:1. The oxide semiconductor layer may be formed to, for instance, a thickness of several hundred angstroms. Thereafter, by performing a sputtering process onto the substrate 10, a metal oxide layer may be formed on the oxide semiconductor layer. The metal oxide layer may be, for instance, include AgO and may be formed to a thickness of about 300 Å. By simultaneously patterning the metal oxide layer and the oxide semiconductor layer, the oxygen providing layer 60 and the active layer 50 may be formed. By the patterning process, the source and drain electrodes 30 and 40 may be partially exposed. Although not illustrated in the drawings, a protective layer may be further formed on the oxygen providing layer 60 according to another embodiment of the present invention. As described above, after the oxide semiconductor layer and the metal oxide layer are formed on the substrate 10, an inorganic layer may be formed on the metal oxide layer by performing an atomic layer deposition process onto the substrate 10. The inorganic layer may be, for instance, $Al_2O_3$. Thereafter, by simultaneously patterning the inorganic layer, the metal oxide layer, and the oxide semiconductor layer, the protective layer, the oxygen providing layer 60, and the active layer 50 may be formed.

Figure 8:
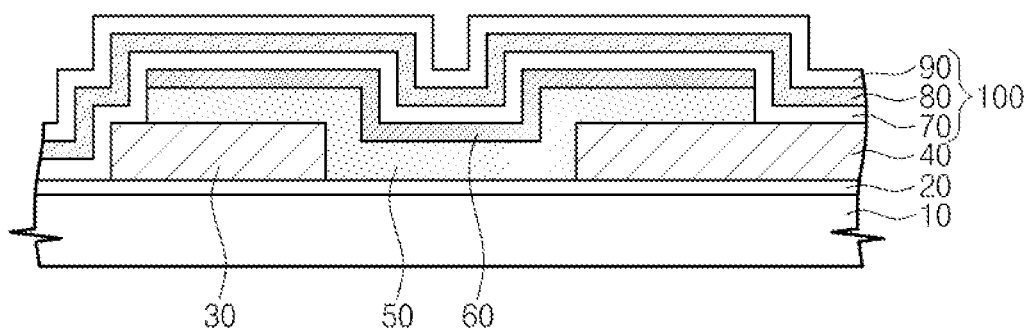

Referring to FIGS. 5 and 8, a gate dielectric 100 is formed on the oxygen providing layer 60 in operation S30. Firstly, by performing an atomic layer deposition process onto the oxygen providing layer 60, a first insulating layer 70 may be formed. By performing a spin coating process onto the first insulating layer 70 and performing an annealing process in a hot plate or vacuum oven, a second insulating layer 80 may be formed. Thereafter, by performing an atomic layer deposition process onto the second insulating layer 80, a third insulating layer 90 may be formed. The first and third insulating layers 70 and 90 may include inorganic materials and may be formed to the same thickness. For instance, the first and third insulating layers 70 and 90 may include $Al_2O_3$. The second insulating layer 80 may include organic materials and may be formed to a thickness of about 3000 Å or less. In this manner, a gate dielectric 100 in which the first to third insulating layers 70, 80, and 90 are sequentially stacked may be formed. The gate dielectric 100 may cover the oxygen providing layer 60, the active layer 50, the source and drain electrodes 30 and 40, and the buffer layer 20.

Figure 9:
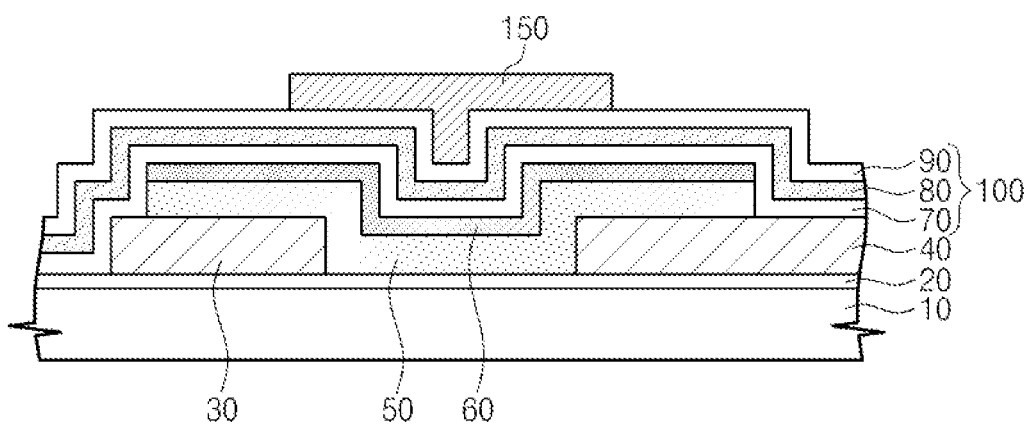

Referring to FIGS. 5 and 9, a gate electrode 150 is formed on the gate dielectric 100 in operation S40. By performing a metallization process onto the gate dielectric 100, a second conductive layer may be formed. Or, the second conductive layer may be formed on the gate dielectric 100 by using an electron-beam evaporator or a thermal evaporator. The second conductive layer may include the same materials as the first conductive layer. By patterning the second conductive layer, the gate electrode 150 may be formed.

Figure 10:
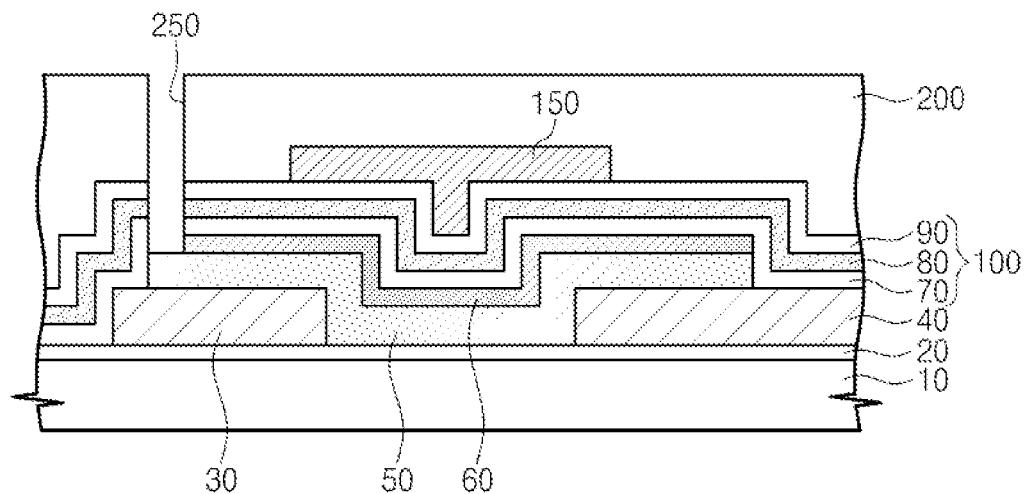

Referring to FIGS. 5 and 10, a planarizing layer 200 and a hole 250 are formed on the substrate 10 in operation S50. By performing a spin coating process onto the gate electrode 150 and the gate dielectric 100, the planarizing layer 200 may be formed. The planarizing layer 200 may include photoreactive organic materials. Thereafter, by performing a patterning process onto the planarizing layer 200, a hole 250 passing through the planarizing layer 200, the gate dielectric 100, and the oxygen providing layer 60 may be formed. The hole 250 may partially expose an upper surface of the active layer 50.

Figure 11:
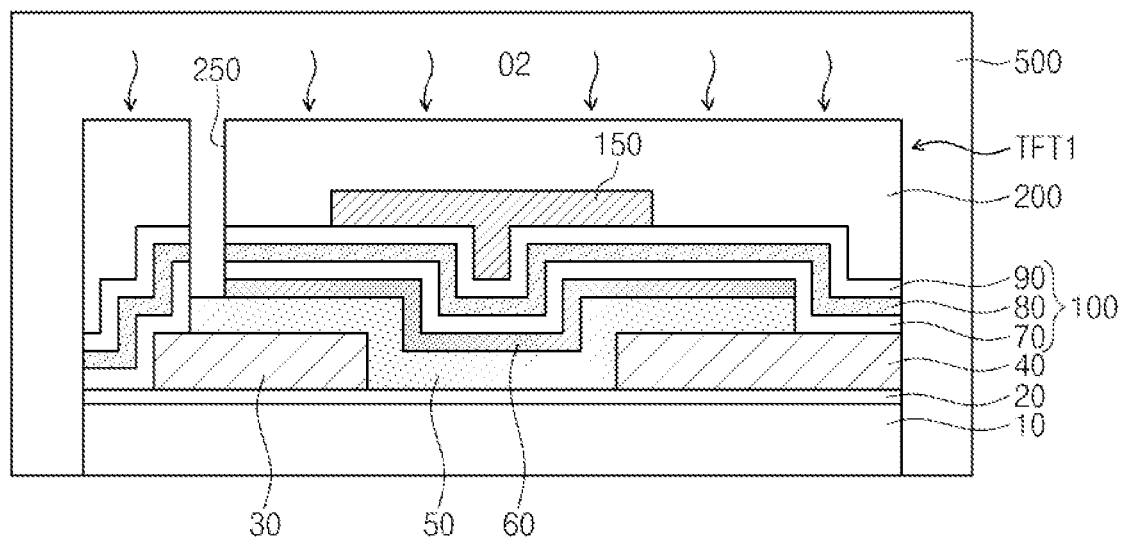
Figure 12:
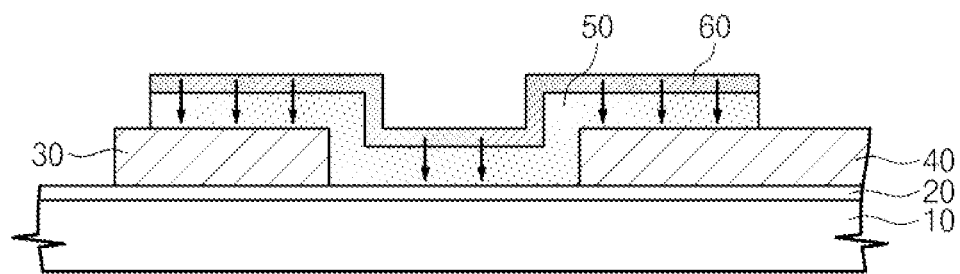

Referring to FIGS. 5, 11, and 12, in operation S60, a heat treatment process is performed onto the thin film transistor TFT1 manufactured according to the method that has been described with reference to FIGS. 5 to 10. The heat treatment process may be performed at a second temperature higher than the first temperature. For instance, firstly, after the thin film transistor TFT1 is formed by using the method described with reference to FIGS. 5 to 10, the thin film transistor TFT1 is provided into an electric furnace 500. The electric furnace 500 may be vacuous. Oxygen gas (O2) of about 100 sccm (standard cubic centimeter per minute) to about 200 sccm may be supplied into the electric furnace 500. The oxygen gas may have high purity of about 4 N (nine) to about 5 N. When the oxygen providing layer 60 includes AgO, the first temperature may be about 100° C., and the heat treatment process may be performed at the second temperature of about 150° C. to about 220° C. The heat treatment process may be performed for about 1 hour to about 5 hours. The electric furnace 500 may be initially maintained at a pressure of about $1.0 \times 10^{-3}$ Torr, and may be maintained at a pressure lower than the above-mentioned pressure.

During the heat treatment process, the oxygen atoms supplied into the electric furnace 500 may move through the hole 250 so as to be supplied into the active layer 50. In detail, the oxide semiconductor in the active layer 50 may have oxygen vacancies. Due to a concentration difference between the oxygen atoms supplied into the electric furnace 500 and the oxygen atoms included in the active layer 50 and due to an increase in kinetic energy of the oxygen atoms caused by the heat treatment process, the oxygen atoms in the electric furnace 500 may be diffused into the active layer 50 via the hole 250. The diffused oxygen atoms may fill the oxygen vacancies of the oxide semiconductor. FIG. 12 is a cross-sectional view magnifying the active layer 50 and the oxygen providing layer 60 during the heat treatment process of FIG. 11. The oxygen providing layer 60 may include a metal oxide that emits oxygen at the first temperature. Therefore, as illustrated in FIG. 12, when heat of the second temperature which is higher than the first temperature is applied to the thin film transistor TFT1 by the heat treatment process, the oxygen atoms in the oxygen providing layer 60 may be emitted so as to be diffused into the active layer 50. The diffused oxygen atoms may fill the oxygen vacancies of the oxide semiconductor.

During the heat treatment process, since the oxygen atoms supplied into the electric furnace 500 and the oxygen atoms in the oxygen providing layer 60 fill the oxygen vacancies of the oxide semiconductor in the active layer 50, the oxygen vacancy concentration in the oxide semiconductor in the active layer 50 may be reduced. Since the oxygen vacancy concentration in the oxide semiconductor in the active layer 50 is reduced, the threshold voltage characteristics of the thin film transistor TFT1 may be improved.

Figure 13:
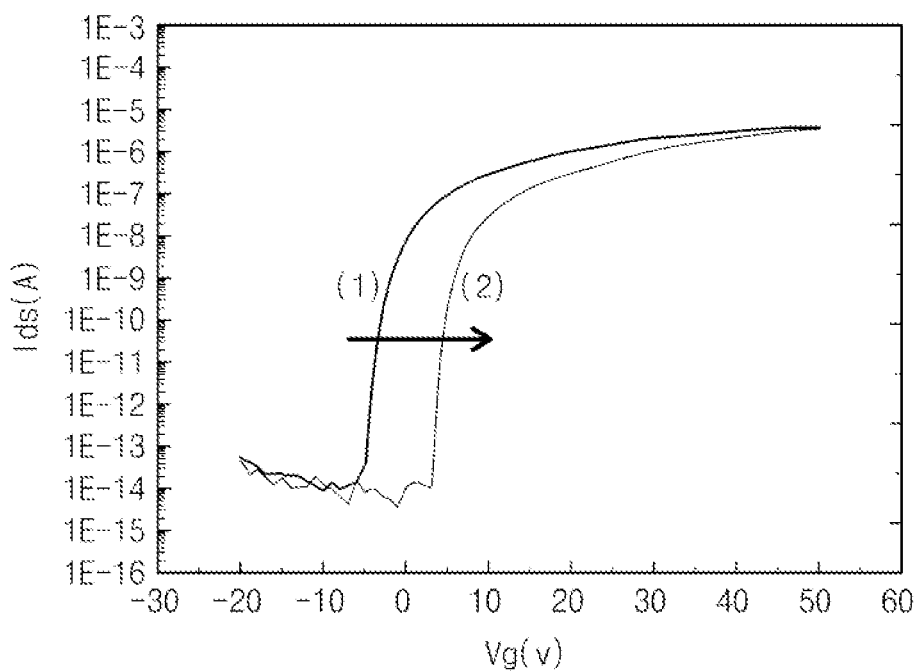
FIGS. 13 to 15 are graphs illustrating on/off characteristics of a thin film transistor according to the concept of the present invention.
Figure 14:
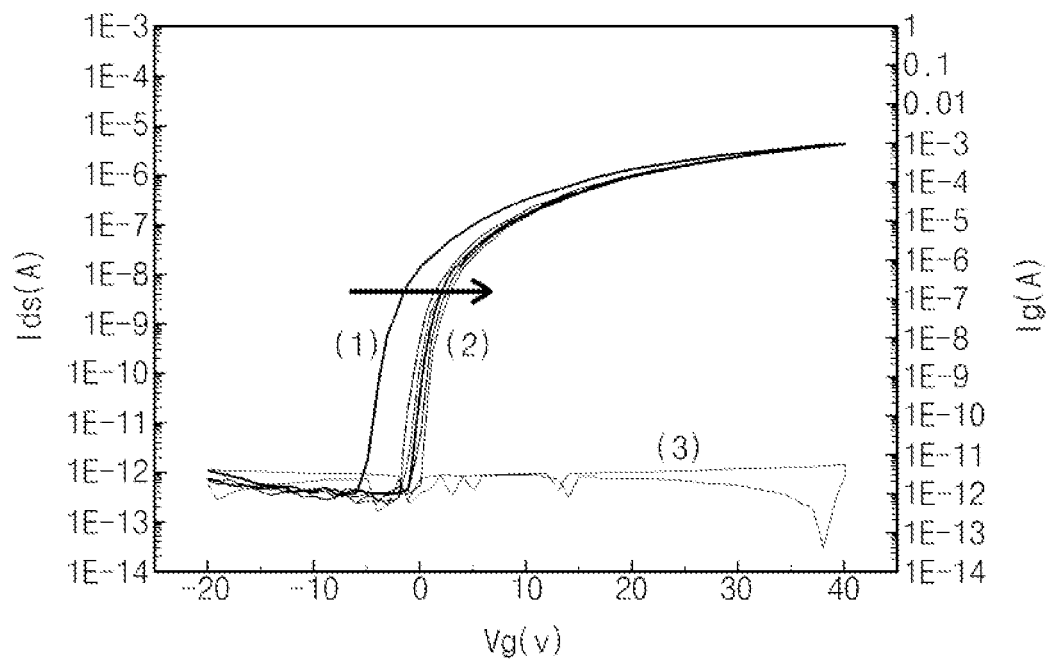
Figure 15:
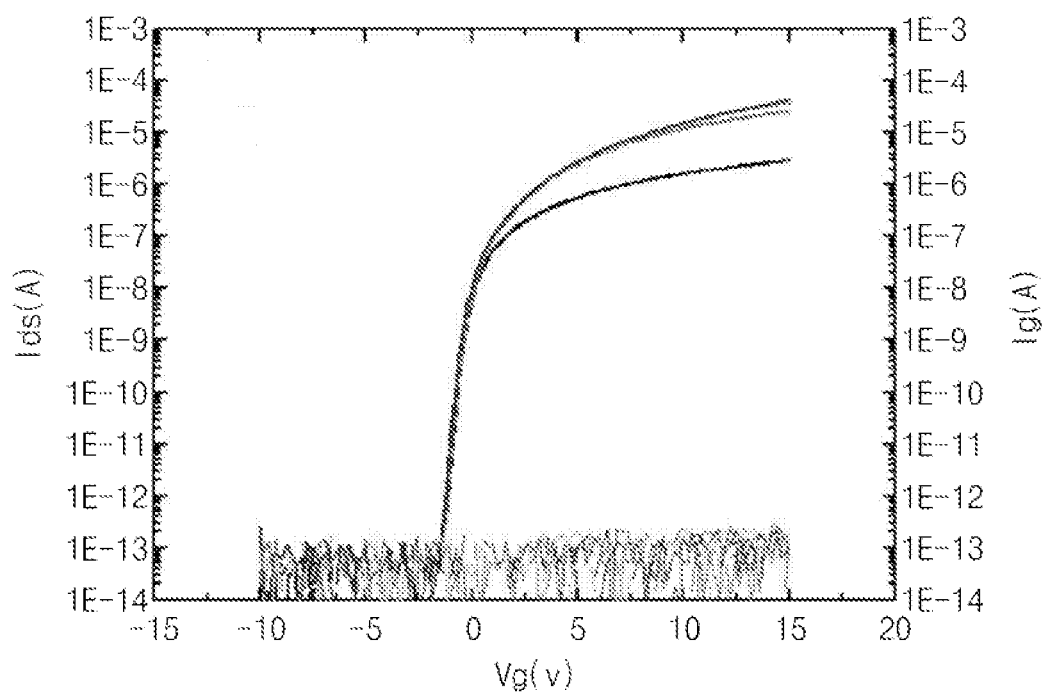

FIGS. 13 to 15 are graphs illustrating on/off characteristics of a thin film transistor according to the concept of the present invention. In FIGS. 13 to 15, Ids represents a current flowing through drain and source electrodes, Vg represents a voltage of a gate electrode, and Ig represents a leakage current of the gate electrode.

Referring to FIGS. 13 and 14, graph (1) indicates a comparative example for illustrating the on/off characteristics of the thin film transistor TFT1 before the heat treatment process is performed thereto, and graph (2) indicates an experimental example for illustrating the on/off characteristics of the thin film transistor TFT1 after the heat treatment process is performed thereto. Graph (3) indicates a value of a leakage current of the gate electrode according to the experimental example of graph (2). Before performing the heat treatment process, a threshold voltage Vth of the thin film transistor may have a negative value smaller than 0 V (graph (1) of FIGS. 13 and 14). However, after performing the heat treatment process according to the concept of the present invention, the threshold voltage Vth of the thin film transistor may be 0 V or may have a positive value greater than 0 V (graph (2) of FIGS. 13 and 14). Further, in the case of the experimental example, it may be confirmed that the leakage current of the gate electrode is stabilized (graph (3) of FIG. 14). It may be confirmed that, since the threshold voltage Vth of the thin film transistor is changed from a negative value to a positive value, the oxygen vacancy concentration in the oxide semiconductor in the active layer 50 is reduced. Since the threshold voltage of the thin film transistor TFT1 is changed from a negative value to a positive value, the thin film transistor TFT1 may be stably operated, and reliability of the thin film transistor TFT1 may be improved.

Referring to FIG. 15, which illustrates experimental examples for illustrating the on/off characteristics of the thin film transistor TFT1 after the heat treatment process is performed thereto according to the concept of the present invention, it may be confirmed that the thin film transistors TFT1 according to the concept of the present invention are stably operated.

According to the concept of the present invention, the oxygen atoms in the electric furnace 500 may be efficiently supplied into the active layer 50 by the hole 250 connected to the active layer 50. Further, since the oxygen providing layer 60 is provided on the active layer 50, the oxygen atoms in the oxygen providing layer 60 may be supplied into the active layer 50 during the heat treatment process. Accordingly, the oxygen atoms are efficiently supplied into the active layer 50, thereby remarkably reducing the oxygen vacancy concentration in the oxide semiconductor in the active layer 50. Since the oxygen vacancy concentration in the active layer 50 is reduced, the thin film transistor TFT1 may be stably operated and reliability thereof may be improved.

According to the embodiments of the present invention, a thin film transistor which can be stably operated and has improved reliability and a method for manufacturing the same can be provided.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for manufacturing a thin film transistor, comprising:

forming a gate electrode on a substrate;

forming an active layer that is adjacent to the gate electrode and comprises an oxide semiconductor;

forming an oxygen providing layer on the active layer;

forming a gate dielectric between the gate electrode and the active layer;

forming source and drain electrodes coupled to the active layer;

forming a planarizing layer covering the gate electrode and the gate dielectric;

forming a hole in the planarizing layer exposing the active layer; and performing a heat treatment process onto the planarizing layer in an atmosphere of oxygen, thereby providing oxygen atoms of the atmosphere of oxygen to the active layer though the hole.

2. The method of claim 1, wherein the oxygen providing layer comprises a metal oxide that emits oxygen at a first temperature.

3. The method of claim 2, wherein the oxygen providing layer comprises AgO.

4. The method of claim 2, wherein the heat treatment process is performed at a second temperature higher than the first temperature.

5. The method of claim 1, wherein oxygen atoms in the oxygen providing layer are supplied into the active layer by the heat treatment process.

6. The method of claim 1, wherein the hole in the planarizing layer passes through the gate dielectric and the oxygen providing layer to expose a part of an upper surface of the active layer.

7. The method of claim 1, further comprising forming a buffer layer on the substrate.

8. The method of claim 1, wherein the forming of the gate dielectric comprises:
    forming a first insulating layer between the gate electrode and the active layer;
    forming a second insulating layer on the first insulating layer; and
    forming a third insulating layer between the first insulating layer and the second insulating layer,
    wherein the first and second insulating layers comprise inorganic materials and the third insulating layer comprises organic materials.

9. The method of claim 1, wherein the hole in the planarizing layer passes through the oxygen providing layer.

10. A method for manufacturing a thin film transistor, comprising:
    forming a gate electrode on a substrate;
    forming an active layer that is adjacent to the gate electrode and comprises an oxide semiconductor;
    forming an oxygen providing layer on the active layer;
    forming a gate dielectric between the gate electrode and the active layer;
    forming source and drain electrodes coupled to the active layer;
    forming a planarizing layer covering the gate electrode and the gate dielectric;
    forming a hole exposing the active layer; and
    performing a heat treatment process onto the planarizing layer in an atmosphere of oxygen,
    wherein oxygen atoms from the atmosphere of oxygen are supplied into the active layer through the hole.

11. The method of claim 10, wherein the hole passes through the planarizing layer and the oxygen providing layer.

12. The method of claim 11, wherein the hole further passes through the gate dielectric.

13. A method for manufacturing a thin film transistor, comprising:
    forming a gate electrode on a substrate;
    forming an active layer that is adjacent to the gate electrode and comprises an oxide semiconductor;
    forming an oxygen providing layer on the active layer;
    forming a gate dielectric between the gate electrode and the active layer;
    forming source and drain electrodes coupled to the active layer;
    forming a planarizing layer covering the gate electrode and the gate dielectric;
    forming a hole exposing the active layer; and
    performing a heat treatment process onto the planarizing layer in an atmosphere of oxygen, thereby providing oxygen from the atmosphere of oxygen to the active layer through the hole,
    wherein the hole passes through the planarizing layer, the gate dielectric, and the oxygen providing layer to expose a part of an upper surface of the active layer.

* * * * *